United States Patent [19]

Oh et al.

[11] Patent Number: 5,130,581
[45] Date of Patent: Jul. 14, 1992

[54] SENSE AMPLIFIER IN A DYNAMIC RAM HAVING DOUBLE POWER LINES

[75] Inventors: Jong H. Oh, Kyungki-Do; Jung P. Kim, Seoul, both of Rep. of Korea

[73] Assignee: Hyundai Electronics Industries Co., Ltd., Rep. of Korea

[21] Appl. No.: 615,879

[22] Filed: Nov. 20, 1990

[30] Foreign Application Priority Data

Nov. 28, 1989 [KR] Rep. of Korea ............. 89-17290

[51] Int. Cl.⁵ .................. G01R 19/00; H03K 3/26
[52] U.S. Cl. .................................. 307/530; 307/279; 365/189.05
[58] Field of Search .............. 307/530, 279, 443; 365/189.05

[56] References Cited

U.S. PATENT DOCUMENTS

| | | | |
|---|---|---|---|
| 4,656,370 | 4/1987 | Kanuma | 307/443 |
| 4,827,454 | 5/1989 | Okazaki | 365/189.05 |
| 4,845,681 | 7/1989 | Vu et al. | 365/189.05 |
| 4,855,628 | 8/1989 | Jun | 307/279 |
| 4,857,765 | 8/1989 | Cahill et al. | 307/443 |
| 4,926,379 | 5/1990 | Yoshida | 365/230.01 |
| 4,973,864 | 11/1990 | Nogami | 307/279 |
| 5,038,324 | 8/1991 | Oh | 365/189.05 |

Primary Examiner—David Hudspeth
Assistant Examiner—Andrew Sanders
Attorney, Agent, or Firm—Merchant, Gould, Smith, Edell, Welter & Schmidt

[57] ABSTRACT

A sense amplifier for sensing and amplifying data existing at a pair of bit lines in a DRAM and having double power lines for supplying separate supply voltages to a P-channel sense amplifying unit and to an N-channel sense amplifying unit in a partially activatable DRAM and comprising a memory cell array apparatus having a pair of bit lines BL and BL is disclosed whereby a peak current occurrence in the partially activatable DRAM is prevented and the sensing ability of the sense amplifier is increased.

4 Claims, 3 Drawing Sheets

SENSE AMPLIFIER IN A DYNAMIC RAM HAVING DOUBLE POWER LINES

BACKGROUND OF THE INVENTION

1. Field of the Invention

The invention relates to a sense amplifier in a DRAM (Dynamic RAM) having double power lines, and more particularly, to a sense amplifier in a partially activatable DRAM having double power lines with an increased sensing ability and a low peak current value.

2. Information Disclosure Statement

Generally, when information data is stored in a memory cell and read from the memory cell, a sense amplifier for sensing and amplifying the information data existed at a pair of bit lines is used in a DRAM. Thus, it is necessary to have sense driving transistors with a large gate width, that is a N-channel sense amplifying unit, and restore driving transistors with a large gate width, that is a P-channel sense amplifying unit, in order to sense and amplify each information data having a little voltage difference between a pair of bit lines.

However, in case of using the driving transistors having a large gate width, there is a disadvantage in that the sense amplifier fails to properly perform due to a high peak current value and a lack of equilibrium in the capacitance between the pair of bit lines. Furthermore, where the driving transistor having a small gate width in order to have a low peak current value, there are disadvantages in that the access time becomes long and the sensing velocity of the sense amplifier is decreased.

For solving above mentioned problems, one method uses a separate power line is independently used in each P-channel and N-channel amplifying unit of the sense amplifier so that the peak current value is decreased.

However, where a separate power line is used in the sense amplifier, when the sense amplifier operates in its slope sensing in the first step of the sensing operation, the separate power lines for supplying separate voltage sources Vcc and Vss, respectively, to each P-channel and N-channel amplifying unit already contain a substantial amount of the noise owing to its inductance. Therefore, it is impossible to solve the disadvantage of the prior art. Also, in a partially activatable DRAM comprising a plurality of blocks, a driving transistor in an unselected block not requiring the information output and having the same gate width as that of the driving transistor in a selected block is also operated so that a high peak current value occurs in the DRAM.

Accordingly, it is an object of the present invention to solve the disadvantages mentioned above and to provide a sense amplifier in the DRAM having double power lines.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The sense amplifier in a dynamic ram having double power lines of the present invention is defined by the claims with a specific embodiment shown in the attached drawings. For the purpose of summarizing the invention, the invention relates to a sense amplifier in a partially activatable DRAM comprising a memory cell array apparatus having a pair of bit lines BL and $\overline{BL}$ (first and second bit lines, respectively). The sense amplifier comprises a P-channel sense amplifying unit 2 including MOSFETs Q1 and Q2 with each having a pair of electrodes, with one electrode of each the MOSFETs Q1 and Q2 connected to a junction P1 and a junction P2, respectively, with the junction P1 and the junction P2 being connected to each other, and with each remaining electrode of each the MOSFETs Q1 and Q2 connected to the bit line $\overline{BL}$ and BL, respectively. Each MOSFET Q1 and Q2 further includes a gate electrode which are cross coupled to each other to thereby connect MOSFETs Q1 and Q2 to each bit line BL and $\overline{BL}$, respectively. A MOSFET Q3 is used having a pair of electrodes with one electrode connected to junction P1 and the remaining electrode connected, through a power line PC1, to a voltage source Vcc1, and a gate electrode connected to receive a sense control signal $\phi$SPE0. A MOSFET Q4 is utilized having a pair of electrodes with one electrode connected to junction P2 and the remaining electrode connected, through a power line PC2, to a voltage source Vcc2. A gate electrode of MOSFET Q4 is connected to receive a sense control signal $\phi$SPE1 such that, in use, MOSFETs Q3 and Q4 turn "ON" or "OFF" depending upon each sense control signal $\phi$SPE0 and $\phi$SPE1, respectively, being applied to the respective gate electrodes of MOSFETs Q3 and Q4. An N-channel sense amplifying unit 3 is used and which includes MOSFETs Q5 and Q6. Each of the MOSFET Q5 and Q6 have a pair of electrodes with an electrode of each MOSFET Q5 and Q6 connected to a junction P3 and a junction P4, respectively, with the junction P3 and the junction P4 being connected to each other, and with each remaining electrode of each MOSFET Q5 and Q6 being connected to bit line $\overline{BL}$ and BL, respectively. Each said MOSFET Q5 and Q6 further includes a gate electrode which are cross coupled to each other and are connected to bit line $\overline{BL}$ and BL, respectively. A MOSFET Q7 is employed with a pair of electrodes with one electrodes connected to junction P3 and the remaining electrode connected, through a power line PS1, to a voltage source Vss1. A gate electrode of MOSFET Q7 is connected to receive a sense control signal $\phi$SNE0. A MOSFET Q8 is used with a pair of electrodes with one electrode connected to said junction P4 and with the remaining electrode connected, through a power line PS2, to a voltage source Vss2. A gate electrode of MOSFET Q8 is connected, through a junction P6, to receive a sense control signal $\phi$SNE1 such that, in use, the MOSFET Q7 and Q8 turn "ON" or "OFF" depending upon each sense control signal $\angle$SNE0 and $\phi$SNE1, respectively, being applied to their gate electrodes. A sense output means 4 is used with each MOSFETs Q9 and Q10 therein further including a pair of electrodes with one electrode of each MOSFET Q9 and Q10 connected to the bit line BL and $\overline{BL}$, respectively. Each MOSFET Q9 and Q10 has a gate electrode with each gate electrode connected to a junction P5 to receive a Y-address signal such that, in use, MOSFETs Q9 and Q10 turn "ON" or "OFF" depending upon said Y-address signal being applied, through said junction P5, to their gate electrodes, thereby preventing a peak current occurrence in said partially activatable DRAM, and increasing the sensing ability of the sense amplifier.

Preferably, MOSFET Q1, Q2, Q3 and Q4 are P-channel MOSFETs and MOSFET Q5, Q6, Q7, Q8, Q9 and Q10 are N-channel MOSFETs.

A further embodiment of the present invention may be summarized as a sense amplifier in a partially activatable DRAM having a memory cell array apparatus with a pair of bit lines BL and $\overline{BL}$ and which comprises a P-channel sense amplifying unit 2 with MOSFETs Q1 and Q2 each having a pair of electrodes, with one electrode of each MOSFET Q1 and Q2 connected to a junction P1 and a junction P2, respectively, with the junction P1 and the junction P2 connected to each other, and with the remaining electrode of each MOSFETs Q1 and Q2 connected to each bit line $\overline{BL}$ and BL, respectively. Each MOSFET Q1 and Q2 includes a gate electrode, which are cross coupled to each other thereby connecting the gate electrode of the MOSFET Q1 and Q2 to the bit line BL and $\overline{BL}$, respectively. A MOSFET Q3 is used having a pair of electrodes with one electrode connected to the junction P1, and the remaining electrode connected, through a power line PC, to a voltage source Vcc, and a gate electrode connected to receive a sense control signal $\phi$SPE0. A MOSFET Q4 is used having a pair of electrodes with one electrodes connected to the junction P2, and the remaining electrode connected, through said power line PC, to the voltage source Vcc, and a gate electrode connected to receive a sense control signal $\phi$SPE1 such that, in use, MOSFETs Q3 and Q4 turn "ON" or "OFF" depending upon each the sense control signal $\phi$SPE0 and $\phi$SPE1 being applied to the gate electrodes of the MOSFETs Q3 and Q4, respectively. An N-channel sense amplifying unit 3 is employed with a pair of MOSFET Q5 and Q6 with each MOSFET Q5 and Q6 having a pair of electrodes, with one electrode of each MOSFETs Q5 and Q6 connected to a junction P3 and a junction P4, respectively, with the junction P3 and P4 connected to each other, and with each remaining electrode of each MOSFET Q5 and Q6 connected to the bit line $\overline{BL}$ and BL, respectively. Each of the MOSFETs Q5 and Q6 further include a gate electrode which are cross coupled to each other thereby connecting the gate electrodes of the MOSFET Q5 and Q6 to, to the bit line BL and $\overline{BL}$, respectively. A MOSFET Q7 is utilized having a pair of electrodes, with one electrodes connected to the junction P3 and the remaining electrode connected, via a junction P7 and through a power line PS1, to a voltage source Vss1, and a gate electrode connected to receive a sense control signal $\phi$SNE0. A MOSFET Q8 is used having a pair of electrodes with one electrode connected to the junction P4 and with the remaining electrode connected, via junction P7 and through the power line PS1, to a voltage source Vss1, and a gate electrode connected to receive a sense control signal $\phi$SNE1, through a junction P6, such that, in use, the MOSFETs Q7 and Q8 turn "ON" or "OFF" depending upon each the sense control signal $\phi$SNE0 and $\phi$SNE1, respectively, being applied to the gate electrodes of the MOSFET Q7 and Q8, respectively. A selecting block control means connected to said junction P6 to receive the sense control signal $\phi$SNE1 and connected to receive a selecting block signal $\phi$SEL from the partially activatable DRAM, to thereby output a selecting control signal $\phi$SNE2. A MOSFET Q11 is used having a pair of electrodes with one electrode connected to the junction P4 and with the remaining electrode connected to a voltage source Vss2, and a gate electrode connected to receive the selecting control signal $\phi$SNE2 outputted from the selecting block control means. A sense output means is used having MOSFETs Q9 and Q10 with each MOSFET Q9 and Q10 having a pair of electrodes with one of electrode of each MOSFET Q9 and Q10 connected to the bit line BL and $\overline{BL}$, respectively. Each MOSFET Q9 and Q10 includes a gate electrode with each gate electrode connected to a junction P5 to receive a Y-address signal such that, in use, the MOSFETs Q9 and Q10 turn "ON" or "OFF" depending upon the Y-address signal being applied, through said junction P5, to the gate electrodes of the MOSFETs Q9 and Q10, thereby preventing a peak current occurrence in the partially activatable DRAM, and increasing the sensing ability of said sense amplifier.

Preferably, MOSFETs Q1, Q2, Q3 and Q4 are P-channel MOSFETs and MOSFETs Q5, Q6, Q7, Q8, Q9, Q10 and Q11 are N-channel MOSFETs.

In the preferred embodiment, the selecting block control means comprises a NAND gate G1 connected to receive the sense control signal $\phi$SNE1 and the selecting block signal $\phi$SEL, and a NOT gate G2, directly, connected to the NAND gate G1 to thereby output the selecting control signal $\phi$SNE2.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
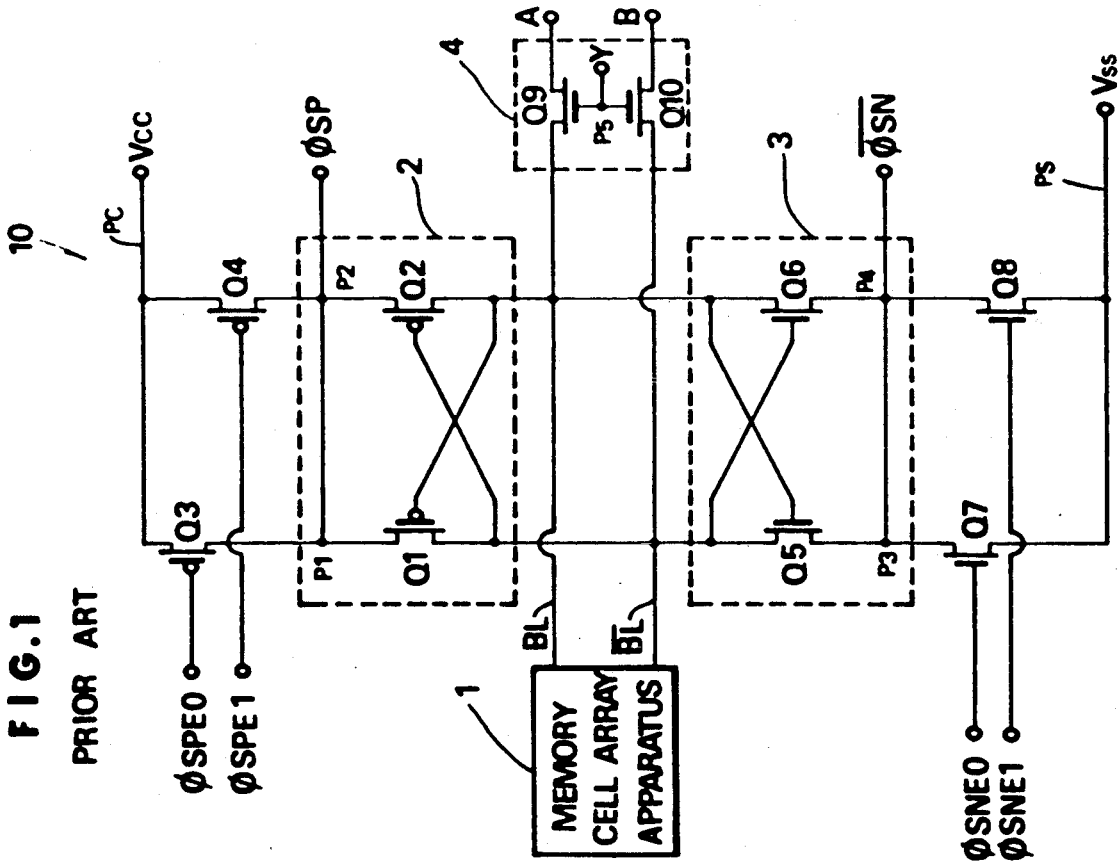
FIG. 1 illustrates a sense amplifier in a DRAM having a separate power line according to the prior art.

FIG. 1 illustrates a prior art sense amplifier 10 in a DRAM having a separate power line.

A bit line $\overline{BL}$ of a memory cell array apparatus 1 is connected to: (1) a voltage source Vcc via P-channel MOSFETs Q1 and Q3 which are connected in serial to each other at a junction P1 and through a power line PC to the voltage source Vcc; and, (2) a voltage source Vss via N-channel MOSFETs Q5 and Q7 which are connected in serial to each other at junction P3 and through a power line PS to the voltage source Vss. And, a bit line BL of the memory cell array apparatus 1 is connected to: (1) the voltage source Vcc via P-channel MOSFETs Q2 and Q4 which are connected in serial to each other at a junction P2 and through the power line PC to the voltage source Vcc; and, (2) the voltage source Vss via N-channel MOSFETs Q6 and Q8 which are connected in serial to each other at a junction P4 and through the power line PS to the voltage source Vss.

In the P-channel MOSFETs Q1 and Q2, each gate electrode thereof is cross coupled to each other, i.e., the gate electrode of MOSFETs Q1 and Q2 is connected to one of the electrodes of MOSFETs Q2 and Q1, respectively, to form a P-channel sense amplifying unit 2. Also in the N-channel MOSFETs Q5 and Q6, each gate electrode thereof is cross coupled each other is formed as a N-channel sense amplifying unit 3.

The P-channel sense amplifying unit 2 and N-channel sense amplifying unit 3 are preferably a P-channel flip-flop circuit and a N-channel flip-flop circuit, respectively.

The gate electrode of the P-channel MOSFET Q1 and the gate electrode of N-channel MOSFET Q5 is connected to the bit line BL, and the gate electrode of the P-channel MOSFET Q2 and the gate electrode of N-channel MOSFET Q6 is connected to the bit line $\overline{BL}$, respectively.

Information data of the memory cell array apparatus 1 is applied, through the bit line BL and $\overline{BL}$, to a sense output means 4. Each signal applied to the sense output means 4 is outputted, through N-channel MOSFETs Q9 and Q10, to each output terminal A and B. Each gate electrode of N-channel MOSFETs Q9 and Q10 is connected to a junction P5. In operation, a Y-address signal is supplied to the junction P5 so that the N-channel MOSFETs Q9 and Q10 are enabled depending upon the Y-address signal. A node $\phi$SP is connected both to the junction P1, positioned between P-channel MOSFETs Q1 and Q3, and to the junction P2, positioned between P-channel MOSFETs Q2 and Q4, in order to sense the potential level of the junction P1 and P2. A node $\phi$SN is connected to the junction P3, positioned between N-channel MOSFETs Q5 and Q7, and to the junction P4, positioned between N-channel Q6 and Q8, in order to sense the potential level of the junction P3 and P4, respectively.

A sense control signal $\phi$SPE0 and $\phi$SPE1 is supplied to each gate electrodes of the P-channel MOSFETs Q3 and Q4, respectively. A sense control signal $\phi$SNE0 and $\phi$SNE1 is also supplied to each gate electrodes of the N-channel MOSFETs Q7 and Q8, respectively.

Accordingly, each MOSFET Q3, Q4, Q7 and Q8 is operates according to the sense control signal supplied to their respective gate electrodes. To prevent a rapid increase of the peak current due to the instantaneous dropping of the potential level of either bit line BL or $\overline{BL}$, the widths of gate electrode of P-channel MOSFETs Q3 and Q4 are designed to be different relative to each other, and the widths of gate electrode of N-channel MOSFETs Q7 and Q8 are also designed to be different relative to each other.

The operation of the sense amplifier 10 which constructed set forth above will be described in conjunction with FIG. 4.

For example, it is assumed that the bit line BL, $\overline{BL}$ and the junction $\phi$SP are charged with 2.5V utilizing the prior art bit line charging apparatus (not shown in drawings). In this state, if one memory cell is selected from the memory cell apparatus 1 and the supply voltage from the bit line charging apparatus is cut off, the potential level of the bit line BL becomes 2.5V and that of the bit line $\overline{BL}$ becomes 2.7V, respectively. Thereafter, at time T1 described in FIG. 4, the P-channel MOSFET Q3 becomes "ON" depending upon the control signal $\phi$SPE0. Accordingly, while the P-channel MOSFET Q1 of the P-channel sense amplifying unit 2 becomes "ON", the P-channel MOSFET Q2 becomes "OFF" so that the potential level of the bit line $\overline{BL}$ is nearly approached, through the power line PC, to the potential level of the voltage source Vcc. At the same time, the N-channel MOSFET Q7 becomes "ON" depending upon the sense control signal $\phi$SNE0. Accordingly, while the N-channel MOSFET Q6 of the N-channel sense amplifying unit 3 becomes "ON", the N-channel MOSFET Q5 becomes "OFF" so that the potential level of the bit line BL is nearly approached to the potential level of the voltage source VSS.

Figure 4:
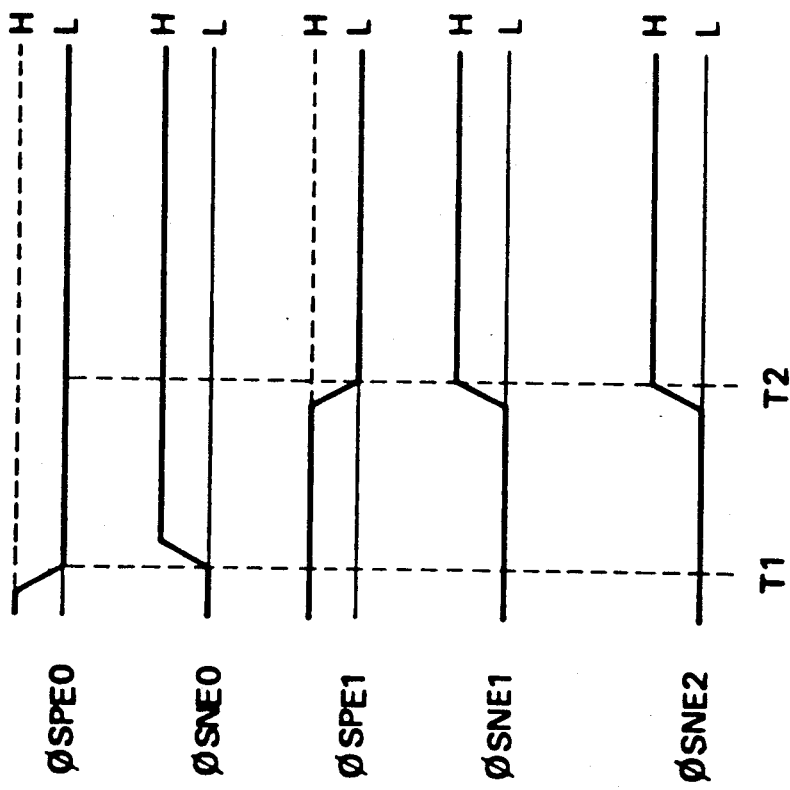
FIG. 4 illustrates a voltage waveform diagram for illustrating operations described in the FIG. 1, FIG. 2 and FIG. 3.

At time T2 described in FIG. 4, the P-channel MOSFET Q4 becomes "ON" depending upon the sense control signal $\phi$SPE1, so that the potential level of the bit line $\overline{BL}$ is finally approached, through the power line PC, to the potential level of the voltage source Vcc. At the same time, the N-channel MOSFET Q8 becomes "ON" depending upon the sense control signal $\phi$SNE1, so that the potential level of the bit line BL is finally approached, through the power line PS, to the potential level of the voltage source Vss. It is noted that, according to the present invention, the mobility of the majority carrier of the P-channel MOSFET Q3 is designed lower than that of the P-channel MOSFET Q4, and the mobility of the majority carrier of the N-channel MOSFET Q7 is designed lower than that of the N-channel MOSFET Q8 respectively.

As mentioned above, the potential level of the bit line $\overline{BL}$ becomes approximately equal to the Vcc potential, according to the sense control signal $\phi$SPE0 and $\phi$SPE1 applied to their gate electrodes of the P-channel MOSFETs Q3 and Q4, with each sense control signal $\phi$SPE0 and $\phi$SPE1 having a predetermined different time sequence relative to each other, respectively, whereas the potential level of the bit line BL becomes approximately equal to the Vss potential, step by step, according to the sense control signal $\phi$SNE0 and $\phi$SNE1 applied to their gate electrodes of the N-channel MOSFETs Q7 and Q8, with each sense control signal $\phi$SNE0 and $\phi$SNE1 having a predetermined different time sequence relative to each other, respectively.

Accordingly, the potential level of the bit line $\overline{BL}$, that is the potential level of the supply voltage Vcc, and the potential level of the bit line BL, that is the potential level of the voltage source Vss, are outputted, via the N-channel MOSFET Q9 and Q10 with each gate electrode being connected to each other at the junction P5, and operated depending upon the Y-address signal applied to the junction P5, to the output terminals A and B, to thereby sense the information data of the memory cell array apparatus 1. In other words, a sense amplifier 10 can detect and amplify a slight voltage difference between the bit line BL and bit line $\overline{BL}$ of the memory cell array apparatus 1 by utilizing the large potential difference between the supply voltage Vcc and Vss.

However, according to the construction described in FIG. 1, when the slope sensing in the first step of the sensing operation is enabled, it is impossible to avoid the disadvantage of occurring the considerable noise at the power V line due to the inductance of a pair of bit line BL and $\overline{BL}$ and increasing the peak current in the partially activatable DRAM.

Figure 2:
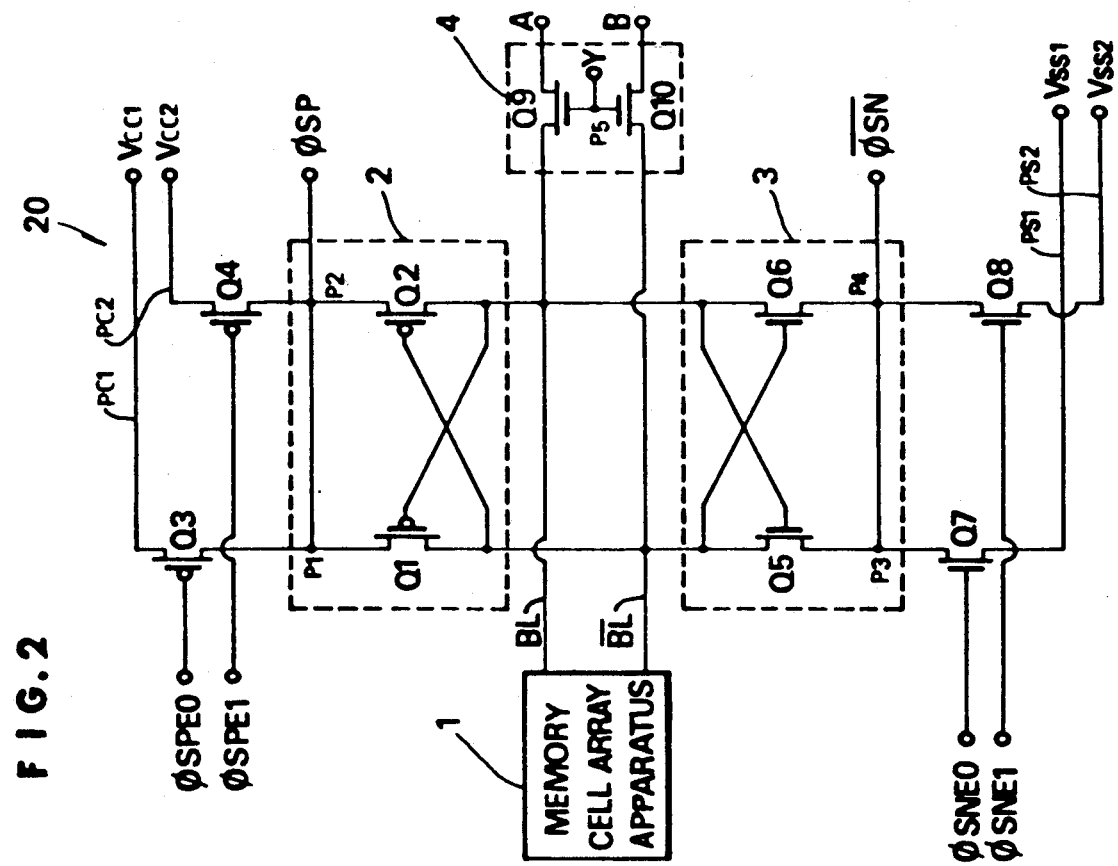
FIG. 2 illustrates a sense amplifier in a DRAM having more than two separate double power lines according to the present invention.

FIG. 2 illustrates a sense amplifier 20 in a DRAM according to the present invention. The sense amplifier 20 includes a separate double power line to avoid the disadvantage of the prior art.

The supply voltage of the P-channel MOSFET Q3 and Q4 is separately provided by a voltage source Vcc1 which is supplied through a power line PC1 and by a voltage source Vcc2 which is supplied through a power line PC2, respectively. Also the supply voltage of the N-channel MOSFET Q7 and Q8 is also separately provided by a voltage source Vss1 which is supplied through a power line PS1 and by a voltage source Vss2 which is supplied through a power line PS2, respectively.

According to the present invention, in order to avoid the noise at the power lines PC1 and PC2 by the voltage sources Vcc1 and Vcc2 at time T1, the separate power lines PS1 and PS2 for the voltage source Vss1 and Vss2 are utilized at time T2, thereby increasing the ability of the sense operation of the sense amplifying units 2 and 3.

As mentioned in FIG. 1, for example, it is assumed that the bit line BL, $\overline{BL}$ and the junction $\phi$SP are charged with 2.5V utilizing the prior art bit line charging apparatus (not shown in drawings), in this state, if one memory cell is selected from the memory cell apparatus 1 and the supply voltage from the bit line charging apparatus is cut off, the potential level of the bit line BL becomes 2.5V and that of the bit line $\overline{BL}$ becomes 2.7V, respectively. Thereafter, at time T1 described in FIG. 4, the P-channel MOSFET Q3 becomes "ON" depending upon the control signal $\phi$SPE0. Accordingly, while the P-channel MOSFET Q1 of the P-channel sense amplifying unit 2 becomes "ON", the P-channel MOSFET Q2 becomes "OFF" so that the potential level of the bit line $\overline{BL}$ is nearly approached, through the power line PC1, to the potential level of the voltage source Vcc1. At the same time, the N-channel MOSFET Q7 becomes "ON" depending upon the sense control signal $\phi$SNE0. Accordingly, while the N-channel MOSFET Q6 of the N-channel sense amplifying unit 3 becomes "ON", the N-channel MOSFET Q5 becomes "OFF" so that the potential level of the bit line BL is nearly approached, through the power line PC2, to the potential level of the voltage source Vss1.

At time T2 described in FIG. 4, the P-channel MOSFET Q4 becomes "ON" depending upon the sense control signal $\phi$SPE1, so that the potential level of the bit line $\overline{BL}$ is approached, through the power line PC2, to the potential level of the voltage source Vcc2. At the same time, the N-channel MOSFET Q8 becomes "ON" depending upon the sense control signal $\phi$SNE11, so that the potential level of the bit line BL is approached, through the power line PS2, to the potential level of the voltage source Vss2. It is noted that, according to the present invention, the mobility of the majority carrier of the P-channel MOSFET Q3 is designed lower than that of the P-channel MOSFET Q4, and the mobility of the majority carrier of the N-channel MOSFET Q7 is designed lower than that of the N-channel MOSFET Q8, respectively. Accordingly, when separate double supply voltages are supplied to the sense amplifier, respectively, the potential difference between the bit line BL and bit line $\overline{BL}$ is larger than the potential difference as described in FIG. 1 so that the information data of the memory cell array apparatus 1 can be sensed rapidly.

Figure 3:
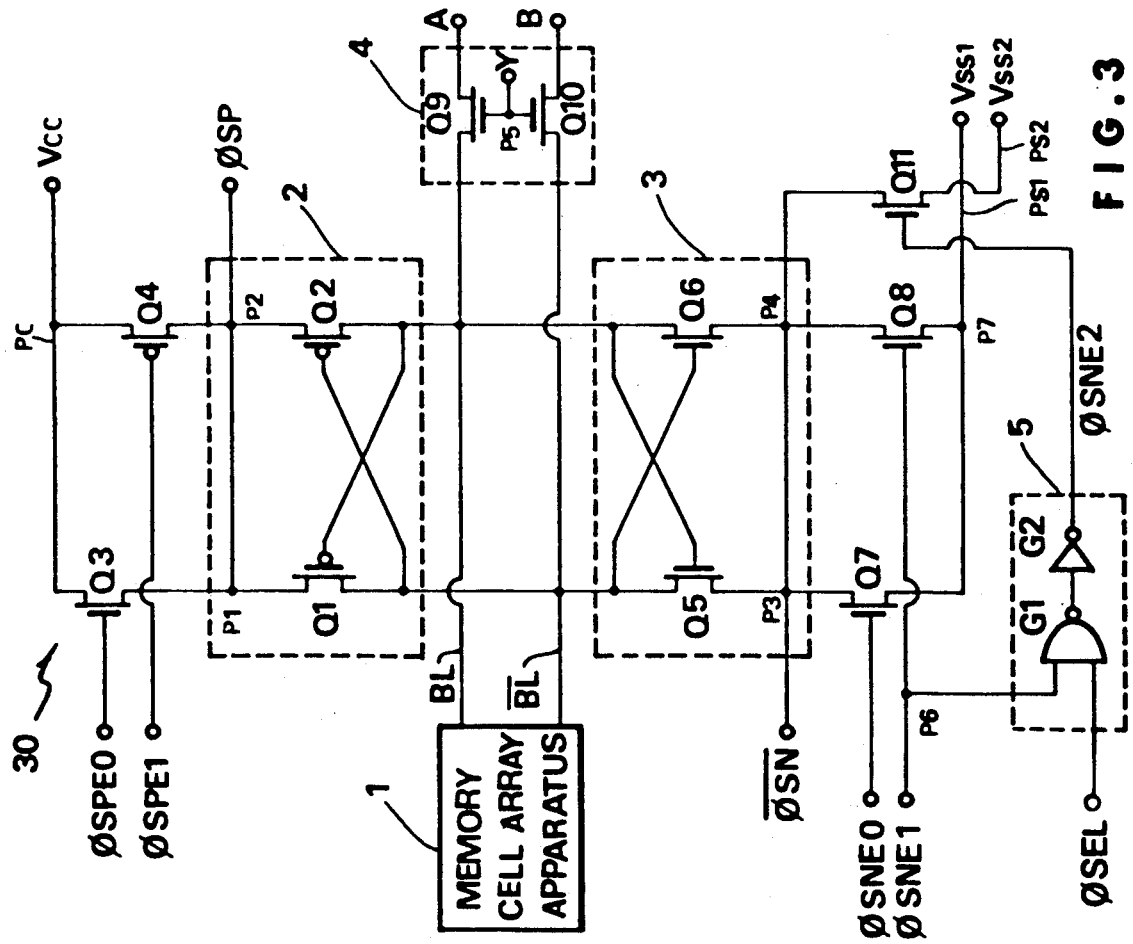
FIG. 3 illustrates one example according to the present invention.

FIG. 3 illustrates a circuit diagram of a sense amplifier 30 according to an example of the present invention, which will be described in conjunction with FIG. 4.

In the construction of the amplifier according to the present invention, a separate voltage source Vss1 is connected, via the power line PS1, to N-channel MOSFETs Q7 and Q8, respectively, through junction P7. A separate voltage source Vss2 is connected, via the power line PS2, to the junction P4 positioned between the N-channel MOSFET Q6 and Q8. The sense control signal $\phi$SNE1 supplied to the gate electrode of the N-channel MOSFET Q8 through the junction P6 and the block selection signal $\phi$SEL (it is a signal for selecting the block in the partially activatable DRAM) of the DRAM form a selecting control signal $\phi$SNE2 in the selecting block control means 5 consisting of NAND gate G1 and NOT gate G2. The selecting control signal is then supplied to the gate electrode of the N-channel MOSFET Q11. The single supply voltage Vcc is applied to the P-channel MOSFETs Q3 and Q4 through the power line PC as illustrated.

Above mentioned construction will be described in conjunction with a plurality of control signal illustrated in FIG. 4.

As mentioned in FIG. 1, for example, it is assumed that the bit line BL, $\overline{BL}$ and the junction $\phi$SP are charged with 2.5V utilizing the prior art bit line charging apparatus (not shown in drawings), in this state, if one memory cell is selected from the memory cell apparatus 1 and the supply voltage from the bit line charging apparatus is cut off, the potential level of the bit line BL becomes 2.5V and that of the bit line $\overline{BL}$ becomes 2.7V, respectively. Thereafter, at time T1 described in FIG. 4, the P-channel MOSFET Q3 becomes "ON" depending upon the control signal $\phi$SPE0. Accordingly, while the P-channel MOSFET Q1 of the P-channel sense amplifying unit 2 becomes "ON", the P-channel MOSFET Q2 becomes "OFF", so that the potential level of the bit line $\overline{BL}$ is nearly approached, through the power line PC, to the potential level of the voltage source Vcc. At the same time, the N-channel MOSFET Q7 becomes "ON" depending upon the sense control signal $\phi$SNE0. Accordingly, while the N-channel MOSFET Q6 of the N-channel sense amplifying unit 3 becomes "ON", the N-channel MOSFET Q5 becomes "OFF", so that the potential level of the bit line BL is nearly approached, through the power line PS1, to the potential level of the voltage source Vss1.

At time T2 described in FIG. 4, the P-channel MOSFET Q4 becomes "ON" depending upon the sense control signal $\phi$SPE1, so that the potential level of the bit line $\overline{BL}$ is finally approached, through the power line PC, to the potential level of the voltage source Vcc. At the same time, the N-channel MOSFET Q8 becomes "ON" depending upon the sense control signal $\phi$SNE1, so that the potential level of the bit line BL is approached, through the power line PS1, to the potential level of the voltage source Vss1. It is noted that, according to the present invention, the mobility of the majority carrier of the P-channel MOSFET Q3 is designed lower than that of the P-channel MOSFET Q4, and the mobility of the majority carrier of the N-channel MOSFET Q7 is designed lower than that of the N-channel MOSFET Q8. If the selecting control signal φSNE2 supplied to the gate electrode of the N-channel MOSFET Q11 from the selecting block control means 5 becomes high level, the N-channel MOSFET Q11 becomes "ON". Accordingly, the potential of the bit line BL of the memory cell array apparatus 1 becomes nearly equal to the potential Vcc, whereas the bit line $\overline{BL}$ becomes equal to the potential Vss2 through the power line PS2, thereby sensing operation is completed. If the selecting block signal φSEL of the selected block in the partially activatable DRAM (not illustrated in drawings) becomes logic "high" state, the selecting block signal φSEL supplied to the one input terminal of the NAND gate G1 operates the N-channel MOSFET Q11, otherwise if the selecting block signal φSEL of the unselected block in the DRAM becomes logic "low" state, the signal φSEL does not operate the N-channel MOSFET Q11, thereby the peak current in the DRAM can be decreased and the sensing ability can be increased.

Figure 5:
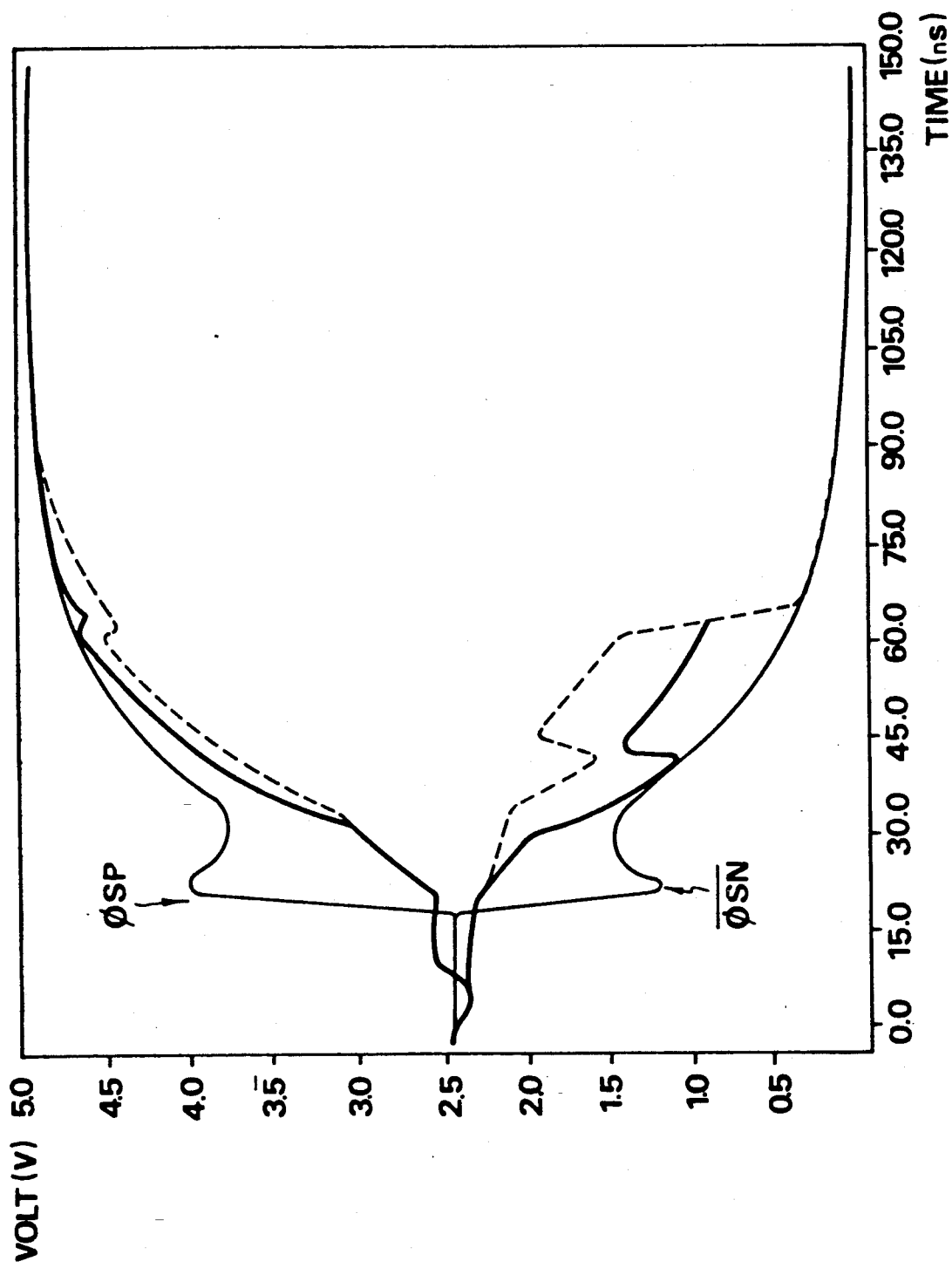
FIG. 5 illustrates a voltage waveform diagram for comparing the voltage characteristic of the prior art with that of the present invention.

FIG. 5 illustrates the voltage waveform diagram comparing the voltage characteristic of the present invention with that of the prior art in which the thin solid line illustrates the voltage waveform diagram at the φSP and φSN node, the dotted line illustrates the voltage difference waveform diagram between bit line BL and $\overline{BL}$ in FIG. 1, and the thick solid line illustrates the voltage difference between the bit line BL and $\overline{BL}$ in FIG. 2 and FIG. 3, respectively.

As illustrated in drawings, since the voltage difference between the pair of bit line BL and $\overline{BL}$ according to the present invention (FIG. 2 and FIG. 3) is illustrated the more rapid and the larger, the information data of the memory cell 1 can be sensed the more rapid and the more static. And, it is noted that since a plurality sense control signal φSPE0, φSPE1, φSNE0 and φSNE1 and selecting control signal φSNE2 illustrated in FIG. 1, FIG. 2, FIG. 3 and FIG. 4 are supplied from the prior art control signal supply source in sequence as illustrated in drawings, the construction of the prior art control signal supply source has been abbreviated to simplicity of the description of the present invention.

As described above, according to the present invention, when the information data of the memory cell is sensed, the stable sensing operation of the information data without noise can be enabled and the sensing ability can be increased and the peak current value can be decreased in the partially activatable DRAM.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A sense amplifier in a partially activatable DRAM comprising a memory cell array apparatus having a first and second bit lines BL and $\overline{BL}$, said sense amplifier comprises:

a P-channel sense amplifying unit comprising a first MOSFET Q1 and a second MOSFET Q2 with each said first Q1 and second Q2 MOSFETs including a pair of electrodes, with an electrode of each said first Q1 and second Q2 MOSFETs connected to a first junction P1 and said second junction P2 being connected to each other, and with each remaining electrode of each said first Q1 and second Q2 MOSFETs connected to said second and first bit lines $\overline{BL}$ and BL, respectively, and each said first Q1 and second Q2 MOSFETs further including a gate electrode, which are cross coupled to each other thereby connecting said gate electrode of each said fist MOSFET Q1 and said second MOSFET Q2 to said first and second bit lines BL and $\overline{BL}$, respectively;

a third MOSFET Q3 having a pair of electrodes with one electrode connected to said first junction P1 and the remaining electrode connected, through a first power line PC1, to a first voltage source Vcc1, and further including a gate electrode connected to receive a first sense control signal φSPE0;

a fourth MOSFET Q4 having a pair of electrodes with one electrode connected to said second junction P2 and the remaining electrode connected, through a second power line PC2, to a second voltage source Vcc2, and further including a gate electrode connected to receive a second sense control signal φSPE1 such that, in use, said third Q3 and fourth Q4 MOSFETs turn "ON" or "OFF" depending upon each said first and said second sense control signal φSPE0 and φSPE1, respectively, being applied to said respective gate electrodes of said third Q3 and fourth Q4 MOSFETs;

an N-channel sense amplifying unit comprising a fifth MOSFET Q5 and a sixth MOSFET Q6 with each said fifth Q5 and sixth Q6 MOSFETs including a pair of electrodes with an electrode of each said fifth Q5 and sixth Q6 MOSFETs connected to a third junction P3 and a fourth junction P4, respectively, with said third junction P3 and said fourth junction P4 being connected to each other, and with each remaining electrode of each said fifth Q5 and sixth Q6 MOSFETs being connected to each said second and first bit line $\overline{BL}$ and BL, respectively, and each said fifth Q5 and sixth Q6 MOSFETs further including a gate electrode, which are cross coupled to each other thereby connecting said gate electrodes of each said fifth Q5 and sixth Q6 MOSFETs to said first and second bit line BL and $\overline{BL}$, respectively;

a seventh MOSFET Q7 having a pair of electrodes with one electrode connected to said third junction P3 and the remaining electrode connected, via a seventh junction P7 and through said first power line PS1, to said first voltage source Vss1, and a gate electrode connected to receive said first sense control signal φSNE0;

an eighth MOSFET Q8 having a pair of electrodes with one electrode connected to said fourth junction P4, and with the remaining electrode connected, via said seventh junction P7 and through said first power line PS1, to said voltage source Vss1, and a gate electrode connected to receive said second sense control signal φSNE1 such that, in use, said seventh Q7 and eighth Q8 MOSFETs turn "ON" or "OFF" depending upon each said first and said second sense control signal φSNE1 and φSNE1, respectively, being applied to their gate electrodes;

a selecting block control means connected to said sixth junction P6 to receive said second sense control signal φSNE1 and connected to receive a selecting block signal φSEL from said partially activatable DRAM, to thereby output a selecting control signal φSNE2 with said selecting block control means comprises a NAND gate G1 connected to receive said second sense control signal directly, connected to said NAND gate G1, to thereby output said selecting control signal φSNE2;

an eleventh MOSFET Q11 having a pair of electrodes with one electrode connected to said fourth junction P4, and with the remaining electrode connected to said second voltage source Vss2, and a gate electrode connected to receive said selecting control signal φSNE2 outputted from said selecting block control means; and, a sense output means including a ninth MOSFET Q9 and a tenth MOSFET Q10 with each said ninth Q9 and tenth Q10 MOSFETs having a pair of electrodes with one electrode of each said ninth Q9 and tenth Q10 MOSFETs connected to said first and second bit line BL and $\overline{BL}$, respectively, and with each said ninth Q9 and tenth Q10 MOSFETs having a gate electrode with each said gate electrode connected to a fifth junction P5 to receive a Y-address signal such that, in use, said ninth Q9 and tenth Q10 MOSFETs turn "ON" or "OFF" depending upon said Y-address signal being applied, through said fifth function P5, to their gate electrodes, thereby preventing a peak current occurrence in said partially activatable DRAM, and increasing the sensing ability of said sense amplifier.

2. The sense amplifier of claim 1, wherein said first Q1, said second Q2, said third Q3 and said fourth Q4 MOSFETs are P-channel MOSFETs.

3. The sense amplifier of claim 1, wherein said fifth Q5, said sixth Q6, said seventh Q7, said eighth Q8, said ninth Q9, said tenth Q10 and said eleventh Q11 MOSFETs are N-channel MOSFETs.

4. A sense amplifier in a partially activatable DRAM comprising a memory cell array apparatus having a first and second bit line BL and $\overline{BL}$, said sense amplifier comprises:

a P-channel sense amplifying unit comprising a first MOSFET Q1 and a second MOSFET Q2 with each said first Q1 and second Q2 MOSFETs being a P-channel MOSFET including a pair of electrodes, with an electrode of each said first Q1 and second Q2 MOSFETs connected to a first junction P1 and a second junction P2, respectively, with said first junction P1 and said second junction P2 being connected to each other, and with each remaining electrode of each said first Q1 and second Q2 MOSFETs connected to said second and first bit lines $\overline{BL}$ and BL, and each said first Q1 and second Q2 MOSFETs further including a gate electrode, which are cross coupled to each other thereby connecting said gate electrode of each said first Q1 and said second Q2 MOSFETs to said first and second bit lines BL and $\overline{BL}$, respectively;

a third MOSFET Q3 being a P-channel MOSFET having a pair of electrodes with one electrode connected to said first junction P1 and the remaining electrode connected, through a first power line PC1, to first voltage source Vcc1, and further including a gate electrode connected to receive a first sense control signal φSPE0;

a fourth MOSFET Q4 being a P-channel MOSFET having a pair of electrodes with one electrode connected to said second junction P2 and the remaining electrode connected, through a second power line PC2, to a second voltage source Vcc2, and further including a gate electrode connected to receive a second sense control signal φSPE1 such that, in use, said third Q3 and fourth Q4 MOSFETs turn "ON" or "OFF" depending upon each said first and said second sense control signal φSPE0 and φSPE1, respectively, being applied to said respective gate electrodes of said third Q3 and fourth Q4 MOSFETs;

an N-channel sense amplifying unit comprising a fifth MOSFET Q5 and a sixth MOSFET Q6 with each said fifth Q5 and said sixth Q6 MOSFETs being an N-channel MOSFET and including a pair of electrodes with an electrode of each said fifth Q5 and sixth Q6 MOSFETs connected to a third junction P3 and a fourth junction P4, respectively, with said third junction P3 and said fourth junction P4 being connected to each other, and with each remaining electrode of each said fifth Q5 and sixth Q6 MOSFETs being connected to each said second and first bit line $\overline{BL}$ and BL, and each said fifth Q5 and sixth Q6 MOSFETs further including a gate electrode, which are cross coupled to each other thereby connecting said gate electrodes of each said fifth Q5 and sixth Q6 MOSFETs to said first and second bit line BL and $\overline{BL}$, respectively;

a seventh MOSFET Q7 being a N-channel MOSFET having a pair of electrodes with one electrode connected to said third junction P3 and the remaining electrode connected, via a seventh junction P7 and through said first power line PS1, to said first voltage source Vss1, and a gate electrode connected to receive said first sense control signal φSNE0;

an eighth MOSFET Q8 being a N-channel MOSFET having a pair of electrodes with one electrode connected to said fourth junction P4, and with the remaining electrode connected, via said seventh junction P7 and through said first power line PS1, to said voltage source Vss1, and a gate electrode connected to receive said second sense controls signal φSNE1 such that, in use, said seventh Q7 and eighth Q8 MOSFETs turn "ON" or "OFF" depending upon each said first and said second sense control signal φSNE0 and φSNE1, respectively, being applied to their gate electrodes;

a selecting block control means connected to said sixth junction P6 to receive said second sense control signal φSNE1 and connected to receive a selecting block signal φSEL from said partially activatable DRAM, to thereby output a selecting control signal φSNE2, wherein said selecting block control means comprises and NAND gate G1 connected to receive said second sense control signal φSNE1 and said selecting block signal φSEL, and a NOT gate G2, directly connected to said NAND gate G1, to thereby output said selecting control signal φSNE2;

an eleventh MOSFET Q11 being a N-channel MOSFET having a pair of electrodes with one electrode connected to said fourth junction P4, and with the remaining electrode connected to said second voltage source Vss2, and a gate electrode connected to receive said selecting control signal φSNE2 outputted from said selecting block control means; and, a sense output means including a ninth MOSFET Q9 and a tenth MOSFET Q10 with each said ninth Q9 and tenth Q10 MOSFET being an N-channel MOSFET having a pair of electrodes with one electrode of each said ninth Q9 and tenth Q10 MOSFETs connected to said first and second bit line BL and $\overline{BL}$, respectively, and with each said ninth Q9 and tenth Q10 MOSFETs having a gate electrode with each said gate electrode connected to a fifth junction P5 to receive a Y-address signal such that, in use, said ninth Q9 and tenth Q10 MOSFETs Turn "ON" and "OFF" depending upon said Y-address signal being applied, through said fifth junction P5, to their gate electrodes, thereby preventing a peak current occurrence in said partially activatable DRAM, and increasing the sensing ability of said sense amplifier.

* * * * *

UNITED STATES PATENT AND TRADEMARK OFFICE
CERTIFICATE OF CORRECTION

PATENT NO. : 5,130,581
DATED : July 14, 1992
INVENTOR(S) : Oh et al.

It is certified that error appears in the above-identified patent and that said Letters Patent is hereby corrected as shown below:

Column 2, line 60; "<SNE0" should read --ØSNE0--.

Column 5, line 54; "ØSN" should read --$\overline{\text{ØSN}}$--.

Column 7, line 14; delete "V" after the word "power".

Column 7, line 67; "ØSNE11" should read --ØSNE1--.

Column 11, line 2, claim 1; "ØSNE1" should read -- ØSNE0--.

Signed and Sealed this

Nineteenth Day of October, 1993

Attest:

BRUCE LEHMAN

*Attesting Officer*   *Commissioner of Patents and Trademarks*